US012764869B2

(12) United States Patent
Sakai et al.

(10) Patent No.: US 12,764,869 B2
(45) Date of Patent: Oct. 13, 2026

(54) CIRCUIT BOARD, METHOD FOR MANUFACTURING CIRCUIT BOARD, AND ELECTRONIC DEVICE

(71) Applicant: FICT LIMITED, Nagano (JP)

(72) Inventors: Taiji Sakai, Nagano (JP); Kenji Iida, Nagano (JP); Norikazu Ozaki, Nagano (JP); Kenji Takano, Nagano (JP); Takashi Nakagawa, Nagano (JP); Takayuki Inaba, Nagano (JP); Tetsuro Miyagawa, Nagano (JP); Akira Yajima, Nagano (JP); Shin Hirano, Nagano (JP); Kota Aoi, Nagano (JP); Yoichi Abe, Nagano (JP); Mio Emura, Nagano (JP)

(73) Assignee: FICT LIMITED, Nagano (JP)

( * ) Notice: Subject to any disclaimer, the term of this patent is extended or adjusted under 35 U.S.C. 154(b) by 273 days.

(21) Appl. No.: 18/271,754

(22) PCT Filed: Feb. 22, 2022

(86) PCT No.: PCT/JP2022/007159
§ 371 (c)(1),
(2) Date: Jul. 11, 2023

(87) PCT Pub. No.: WO2022/185992
PCT Pub. Date: Sep. 9, 2022

(65) Prior Publication Data

US 2024/0064907 A1 Feb. 22, 2024

(30) Foreign Application Priority Data

Mar. 4, 2021 (JP) ................................ 2021-034303
Feb. 17, 2022 (JP) ................................ 2022-022839

(51) Int. Cl.
*H05K 1/18* (2026.01)
*H05K 1/02* (2006.01)
(Continued)

(52) U.S. Cl.
CPC ........... *H05K 1/185* (2013.01); *H05K 1/0201* (2013.01); *H05K 1/0274* (2013.01);
(Continued)

(58) Field of Classification Search
CPC ........ H05K 1/18; H05K 1/185; H05K 1/0274; H05K 3/4644; H05K 1/0271; H05K 2201/10121
(Continued)

(56) References Cited

U.S. PATENT DOCUMENTS 5,621,837 A 4/1997 Yamada et al.
2008/0277776 A1 11/2008 Enomoto
2021/0104637 A1 4/2021 Amano et al.

FOREIGN PATENT DOCUMENTS

JP 8-78657 A 3/1996
JP 2007-201254 A 8/2007
(Continued)

OTHER PUBLICATIONS

Young (KR 10-2015-0087682A), Jul. 30, 2025 (Year: 2015).*
(Continued)

*Primary Examiner* — Tremesha W Burns
(74) *Attorney, Agent, or Firm* — WHDA, LLP

(57) ABSTRACT

An object is to provide a circuit board that includes a built-in semiconductor device and has a configuration that prevents cracking and has excellent reliability in operation over a wide temperature range. As a solution, a circuit board (10A) has a configuration in which a first insulating substrate (1) is laminated on a second insulating substrate (2) while interposing a first adhesive layer (7*a*), and a semiconductor
(Continued)

device (9) is embedded in an embedment portion (1*c*) formed in the first insulating substrate (1).

5 Claims, 3 Drawing Sheets

(51) Int. Cl.
*H05K 1/185* (2026.01)
*H05K 3/46* (2006.01)

(52) U.S. Cl.
CPC ... *H05K 3/4644* (2013.01); *H05K 2201/0129* (2013.01); *H05K 2201/0175* (2013.01); *H05K 2201/062* (2013.01); *H05K 2201/09545* (2013.01); *H05K 2201/096* (2013.01); *H05K 2201/10121* (2013.01); *H05K 2201/10984* (2013.01)

(58) Field of Classification Search
USPC .......................................................... 361/761
See application file for complete search history.

(56) References Cited

FOREIGN PATENT DOCUMENTS

| | | | |
|---|---|---|---|
| JP | 2009-54938 | A | 3/2009 |
| JP | 2020-87938 | A | 6/2020 |
| WO | 2018/198490 | A1 | 11/2018 |

OTHER PUBLICATIONS

Koji (JP 2009-164287A), Jul. 23, 2009 (Year: 2009).*
International Search Report dated May 24, 2022, issued in counterpart International Application No. PCT/ JP2022/007159. (2 pages).

* cited by examiner

CIRCUIT BOARD, METHOD FOR MANUFACTURING CIRCUIT BOARD, AND ELECTRONIC DEVICE

TECHNICAL FIELD

The present invention relates to a circuit board, a method for manufacturing a circuit board, and an electronic device.

BACKGROUND ART

Increases in the amount of data transmission and increases in the amount of heat generation accompanying high-density mounting of information communication devices have increased the need for mounting technology for substrates. For example, an inorganic multilayer substrate has been proposed to reduce cracks in a manufacturing process (PTL 1: JP-A-2020-087938).

CITATION LIST

Patent Literature

PTL 1: JP-A-2020-087938

SUMMARY OF INVENTION

Technical Problem

A structure in which a semiconductor device is embedded in an organic substrate has the risk of cracking under the influence of thermal strain in a high-temperature environment. Inorganic substrates have lower coefficients of thermal expansion, higher flatness, and better dimensional stability over a wide temperature range than organic substrates. On the other hand, inorganic substrates are more fragile than organic substrates and thus involve a joining structure that prevents cracking during a manufacturing process for high-density mounting is required.

Solution to Problem

In view of the foregoing situations, it is an object of the present invention to provide a circuit board that includes a built-in semiconductor device and has a configuration that prevents cracking and has excellent reliability in operation over a wide temperature range.

In one embodiment, the above issue is solved solution disclosed below.

A circuit board according to the invention is a multilayer wiring board in which insulating substrates on which metal layers are formed are laminated through heat-resistant adhesive layers, and the circuit board includes a configuration in which an embedment portion penetrated in a laminating direction in a first insulating substrate of the insulating substrates containing an inorganic material is formed, and a semiconductor device is embedded in the embedment portion.

According to this configuration, a circuit board is provided that includes a built-in semiconductor device and has a configuration that prevents cracking and has excellent reliability in operation over a wide temperature range.

In one example, the semiconductor device is an optical device. This configuration facilitates the fabrication of a circuit board suitable for optical interconnection. In one example, the semiconductor device is an optical device and has a configuration in which a first electronic component is mounted on the first insulating substrate, an optical waveguide is formed on the first insulating substrate, the first electronic component is connected to the optical device, and the optical device is coupled to the optical waveguide. In one example, the semiconductor device is an optical device, an optical waveguide is formed on the first insulating substrate, the optical device is coupled to the optical waveguide, a first electronic component is mounted on the first insulating substrate, and the first electronic component is connected to the optical device. According to this configuration, the circuit board including a built-in optical device can be obtained, and the circuit board suitable for optical interconnection can be obtained by combining the first electronic component, the optical device, and the optical waveguide.

The inorganic material is preferably glass. Glass has high flatness and excellent dimensional stability in a wide temperature range, facilitating the formation of a laminate. In one example, the adhesive layers contain a thermoplastic resin. As a result, thermal strain during curing is reduced, preventing cracking in forming a laminate.

In one example, at least a layer of the adhesive layers that adheres to the first insulating substrate has a laminate structure and has a configuration in which a first layer that is closely attached the first insulating substrate contains a thermosetting resin, and a second layer that is closely attached to the first layer contains a thermoplastic resin. The thermosetting resin contains a resin component having a softening point lower than the softening point of the thermoplastic resin. As a result, thermal strain during curing is reduced, cracking can be prevented when forming the laminate, and also the adhesion to the first insulating substrate can be further improved.

In one example, the semiconductor device has a configuration in which an external electrode of the semiconductor device is connected to an external electrode of an electronic component mounted on an outer layer of the multilayer substrate with the semiconductor device accommodated in the first insulating substrate of the outer layer of the multilayer substrate. In one example, the semiconductor device has a configuration in which an external electrode of the semiconductor device is connected to a wiring pattern provided at the outer layer of the multilayer substrate with the semiconductor device accommodated in the first insulating substrate of an inner layer of the multilayer substrate.

In one example, an external electrode of the semiconductor device is configured to be connected by conductive paste with which a second insulating substrate of the insulating substrates is filled. In one example, an external electrode of the semiconductor device is connected by conductive paste with which a second insulating substrate of the insulating substrates is filled. In one example, the optical device includes a first external electrode and a second external electrode and has a configuration in which the first external electrode is connected to conductive paste with which a second insulating substrate of the insulating substrates is filled, and the second external electrode is connected to the first electronic component. In one example, the optical device includes a first external electrode and a second external electrode, the first external electrode is connected to conductive paste with which a second insulating substrate of the insulating substrates is filled, and the second external electrode is connected to the first electronic component. This configuration facilitates the interlayer connection between the external electrode of the embedded semiconductor device, such as the optical device, and the wiring pattern of the outer layer of the multilayer substrate.

In this specification, the optical device includes a configuration including a photoelectric conversion device, a configuration including an optical switch, a configuration including an optical integrated circuit, a configuration including an optical modulator, a configuration including an optical waveguide, or a configuration including one or more of them. Furthermore, in this specification, the first electronic component and a second electronic component, which is described below, include a configuration including an active element, a configuration including a passive element, a configuration including a semiconductor device, a configuration including an integrated circuit, a configuration including a connector, or a configuration including one or more of them.

In one example, the embedment portion is configured to be formed by etching. In one example, the embedment portion is formed by etching. According to this configuration, in principle, cracking does not occur in the embedment portion during the processing process. In one example, after the lamination process, a protection layer is provided on the surface of the first insulating substrate, the embedment portion is formed by etching, grooves for dicing are formed by etching, and then singulation is performed through dicing along the formed grooves for dicing. This manufacturing method facilitates the formation of the embedment portion without causing cracking in the processing process. Additionally, in singulation, dicing is performed along the grooves for dicing formed by etching. This efficiently achieves singulation while preventing cracking in the substrate edge sections. Here, singulation is a singulation process of dividing a laminate obtained by a lamination process into functional units required as modules or devices used in electronic devices.

In one example, the optical waveguide is formed by patterning or ion exchange processing. In one example, the optical waveguide is formed by patterning or ion exchange processing. According to this configuration, in principle, an optical waveguide can be formed in which cracking does not occur in the processing process. In one example, an optical waveguide is formed that contains univalent Na ions and in which the Na ions are replaced by Ag ions.

A method for manufacturing a circuit board according to the invention is a method for manufacturing a multilayer wiring board by laminating insulating substrates on which metal layers are formed while interposing heat-resistant adhesive layers, wherein an embedment portion penetrated in a laminating direction in a first insulating substrate of the insulating substrates containing an inorganic material is formed, and the method for manufacturing a circuit board includes embedding a semiconductor device in the embedment portion after laminating the first insulating substrate.

According to this manufacturing method, a circuit board is provided that includes a built-in semiconductor device and has a configuration that prevents cracking through a build-up method and has excellent reliability in operation over a wide temperature range. The insulating substrates and the semiconductor device preferably have the coefficients of thermal expansion of the same order, and the coefficient of thermal expansion of each of them is more preferably within 0.5 to 1.5 times that of the first insulating substrate.

Advantageous Effects of Invention

According to the invention, a circuit board is achieved that includes a built-in semiconductor device and has a configuration that prevents cracking and has excellent reliability in operation over a wide temperature range. An electronic device including a circuit board according to the invention can have a configuration that accommodates increases in the amount of data transmission and increases in the amount of heat generation accompanying high-density mounting of information communication devices. In particular, a configuration including the semiconductor device as a built-in optical device can achieve a circuit board suitable for optical interconnection.

DESCRIPTION OF EMBODIMENTS

Figure 1:
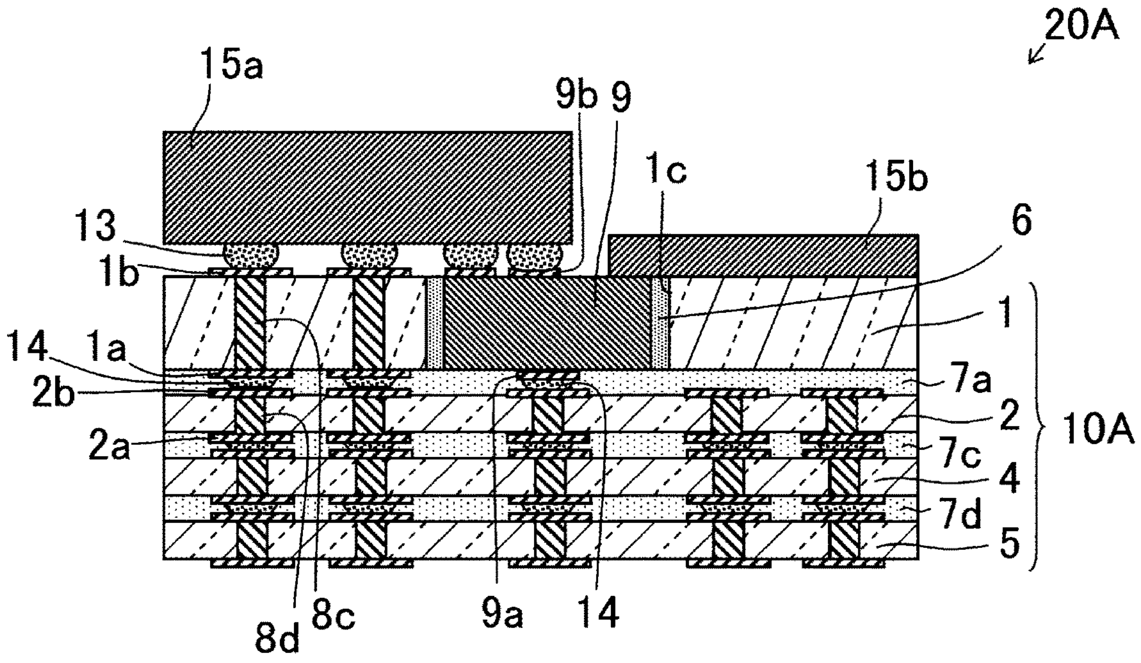
FIG. 1 is a cross-sectional view schematically showing a first example of a circuit board according to an embodiment of the invention.
Figure 2:
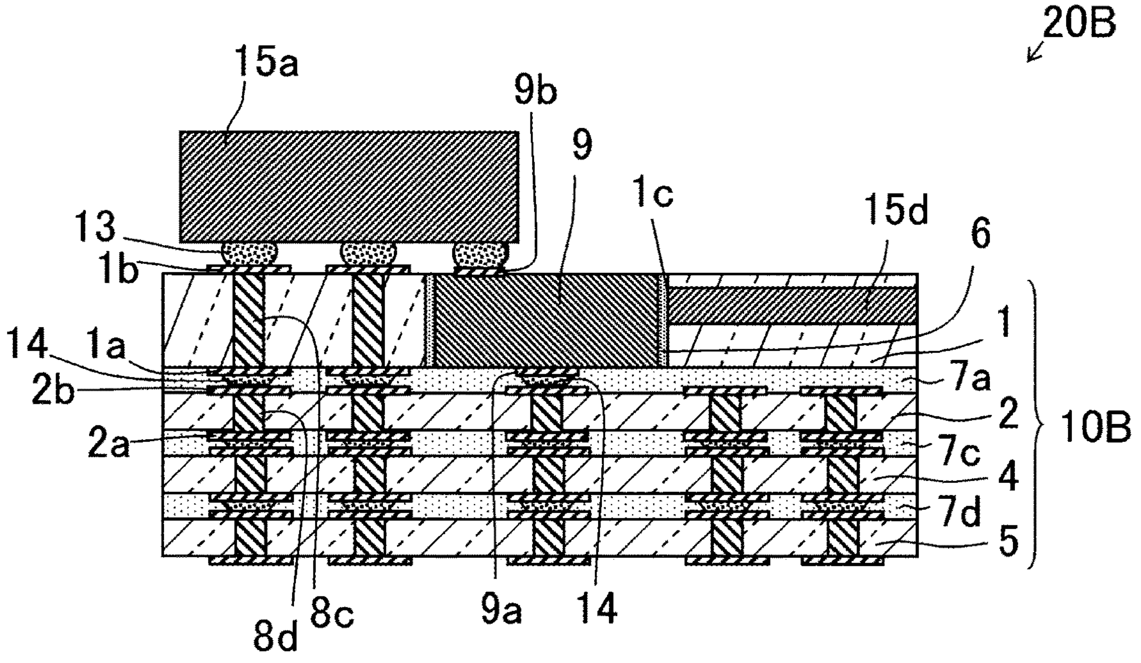
FIG. 2 is a cross-sectional view schematically showing a second example of the circuit board according to an embodiment of the invention.
Figure 3:
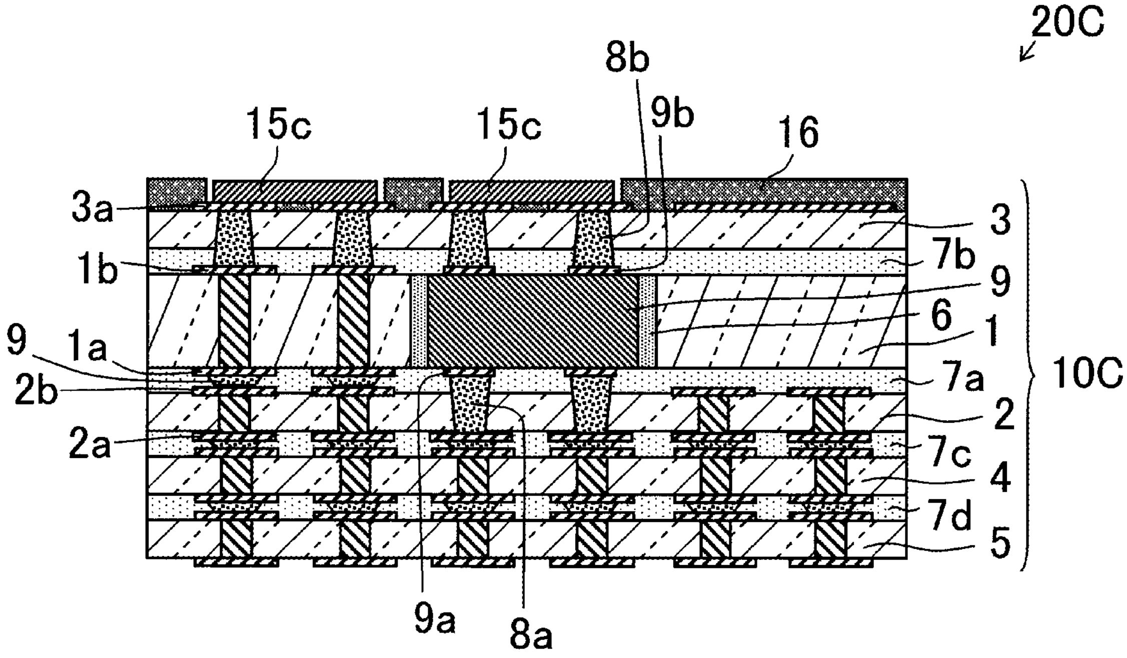
FIG. 3 is a cross-sectional view schematically showing a third example of the circuit board according to an embodiment of the invention.
Figure 4:
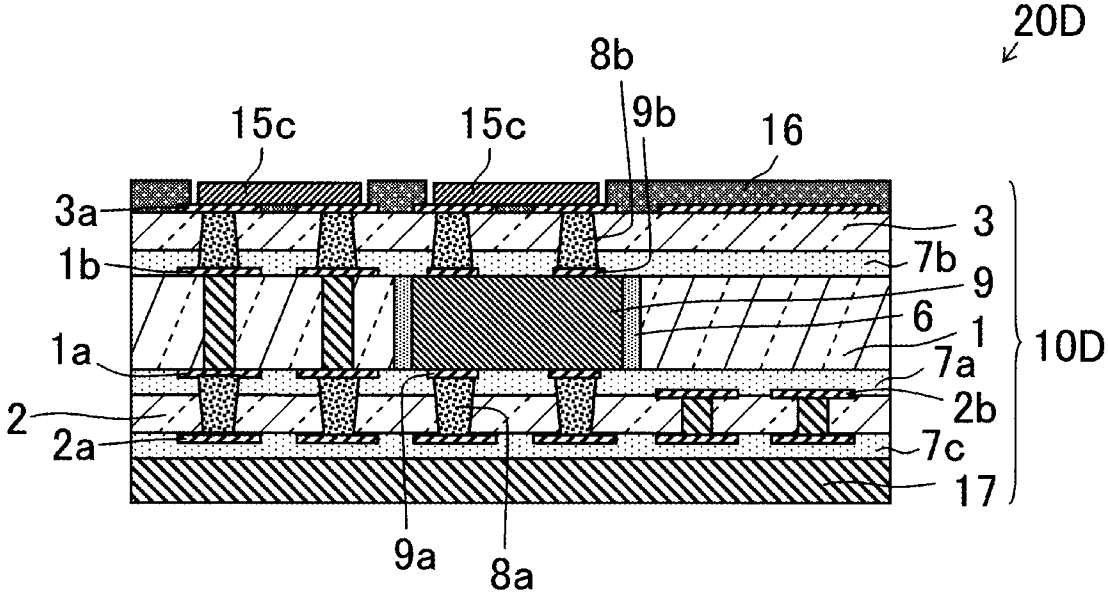
FIG. 4 is a cross-sectional view schematically showing a fourth example of the circuit board according to an embodiment of the invention.

Referring to the drawings, embodiments of the invention are now described in detail. As shown in FIGS. 1 to 4, a circuit board of an embodiment is a multilayer wiring board in which a semiconductor device 9 is embedded, and an electronic device is configured by mounting an electronic component, for example. Throughout the figures illustrating the embodiments, members having the same functions are denoted by the same reference numerals, and repeated description thereof may be omitted.

First Example

The first example is an electronic device 20A including an optical signal processing circuit and an electrical signal processing circuit. In a circuit board 10A, a first insulating substrate 1, which has a lower surface on which a first metal layer 1*a* is formed, is laminated on a second insulating substrate 2, which has a lower surface on which a second metal layer 2*a* is formed, while interposing a first adhesive layer 7*a*. The first insulating substrate 1 has an embedment portion 1*c* penetrated in the laminating direction in the first insulating substrate 1 is formed. A semiconductor device 9 is embedded in the embedment portion 1*c* formed in the first insulating substrate 1. Here, the upper surface is the upper layer side in the laminating direction, and the lower surface is the lower layer side in the laminating direction. The upper surface may be read as a first main surface, and the lower surface may be read as a second main surface on the opposite side of the first main surface. In addition to the above configuration, the present embodiment may be implemented with the upper surface located on the lower layer side in the laminating direction and the lower surface located on the upper layer side in the laminating direction.

The first insulating substrate 1 is made of glass and has a lower surface, on which the first metal layer 1*a* is formed, and an upper surface, on which a fourth metal layer 1*b* is formed. In one example, the first metal layer 1*a* and the fourth metal layer 1*b* each have a seed layer, which includes a titanium (Ti) layer and a copper (Cu) layer, and a plating layer being a Cu layer. The seed layer may be a Cu layer or a Ni layer. In one example, the thickness of the first metal layer 1*a* and the fourth metal layer 1*b* may be 1 to 40 [μm]. The first metal layer 1*a* and the fourth metal layer 1*b* both are provided with wiring patterns made of copper. The thickness of the first insulating substrate 1 is set to be the same as the chip thickness of the semiconductor device 9 or is set according to the upper limit of the chip size tolerance, and the embedment portion 1*c* is sized to accommodate the chip of the semiconductor device 9. The glass may be selected from known electronic materials, and is set to have the same coefficient of thermal expansion as the chip enclosure of the semiconductor device, or set within 0.5 to 1.5 times the coefficient of thermal expansion of the chip enclosure. In one example, the coefficient of thermal expansion of the first insulating substrate 1 is 1 to 7 [ppm/° C.]. In one example, the first insulating substrate 1 is quartz glass, synthetic quartz glass, borosilicate glass, or alkali-free glass. In one example, the thickness of the first insulating substrate 1 is 100 to 500 [μm].

The second insulating substrate 2 is made of glass and has a lower surface, on which the second metal layer 2*a* is formed, and an upper surface, on which a fifth metal layer 2*b* is formed. The second metal layer 2*a* and the fifth metal layer 2*b* are made of the same material as the first metal layer 1*a* and the fourth metal layer 1*b*, and wiring patterns are formed. The second insulating substrate 2 is made of the same material as the first insulating substrate 1, and the thickness of the second insulating substrate 2 is set thinner than that of the first insulating substrate 1. A fourth insulating substrate 4 and a fifth insulating substrate are made of the same material and have the same thickness as the second insulating substrate, and wiring patterns are formed. A third insulating substrate 3, which is described below, is also made of the same material and has the same thickness as the second insulating substrate, and a wiring pattern is formed.

The first adhesive layer 7*a* is made of a thermoplastic resin having excellent heat resistance, which may be fluoropolymer, liquid crystal polymer (LCP), polyimide (PI), and polyphenylene ether (PPE), for example. The first adhesive layer 7*a* does not contain fillers or glass fibers. A third adhesive layer 7*c* and a fourth adhesive layer 7*d* are made of the same material as the first adhesive layer 7*a*. A second adhesive layer 7*b*, which is described below, is also made of the same material as the first adhesive layer 7*a*. In one example, the thickness of the first adhesive layer 7*a* is 1 to 50 [μm]. The thickness of the second adhesive layer 7*b* is set to be the same as the thickness of the first adhesive layer 7*a*, or the thickness of the second adhesive layer 7*b* is set thinner than the first adhesive layer 7*a*.

In one example, the embedment portion 1*c* in the first insulating substrate 1 is formed by etching. In another example, the embedment portion 1*c* in the first insulating substrate 1 is formed in advance by molding during sheet molding. The gap between the embedment portion 1*c* and the semiconductor device 9 is filled with a filler 6 made of a thermoplastic resin. In one example, the filler 6 is made of the same material as the first adhesive layer 7*a*.

The first insulating substrate 1, the second insulating substrate 2, the third insulating substrate 3, the fourth insulating substrate 4, and the fifth insulating substrate 5 each have through holes, and the seed layer and the plating layer are formed at the inner surfaces of the through holes. In each through hole, a plated via, which is formed by plating in the through hole, a paste via, which is formed by conductive paste with which the through hole is filled, or a hybrid via, which is formed by filling a metal-plated through hole with conductive paste, is disposed, for example. In one example, the radius of the through holes may be 5 to 20 [μm], and the conductive paste may be silver (Ag) paste, solder paste, copper (Cu) paste, metal complex, or nanopaste. As solder, an alloy containing two or more of tin (Sn), copper (Cu), bismuth (Bi), silver (Ag), nickel (Ni), and gold (Au) may be used, for example. In one example, conductive paste 14 electrically connects a third via 8*c* made of plating to a fourth via 8*d* made of plating.

Figure 6:
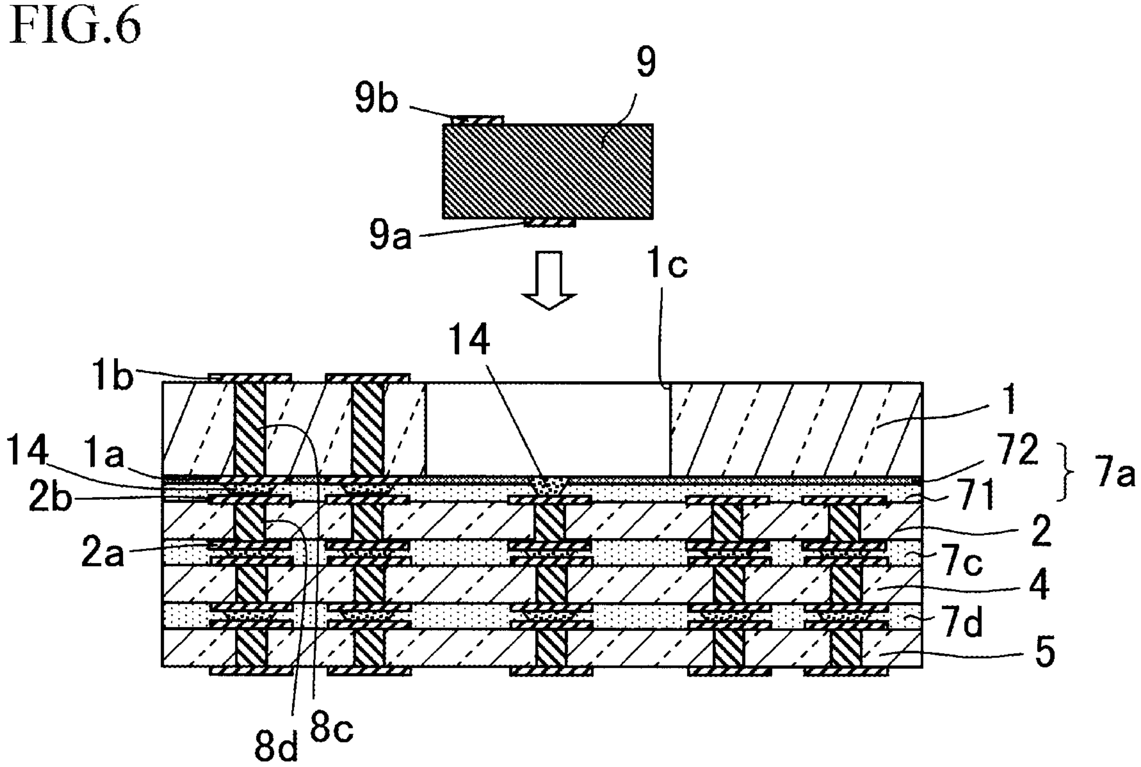
FIG. 6 is a cross-sectional view of a modification of the first example, schematically showing a stage before a semiconductor device is embedded.

FIG. 6 is a cross-sectional view schematically showing a modification of the first example and a laminate in a stage before a semiconductor device 9 is embedded. A method for manufacturing the laminate includes a lamination process in which a fifth insulating substrate 5, a fourth adhesive layer 7*d*, a fourth insulating substrate 4, a third adhesive layer 7*c*, a second insulating substrate 2, a first adhesive layer 7*a*, and a first insulating substrate 1 are built up in this order and collectively subjected to thermocompression bonding. The first adhesive layer 7*a* has a laminate structure in which a first layer 72 is placed on a second layer 71. The second layer 71 of the first adhesive layer 7*a* contains a thermoplastic resin, the lower surface of the second layer 71 is closely attached the second insulating substrate 2, and the upper surface of the second layer 71 is closely attached to the first layer 72. The first layer 72 of the first adhesive layer 7*a* contains a thermosetting resin, the lower surface of the first layer 72 is closely attached the second layer 71, and the upper surface of the first layer 72 is closely attached to the first insulating substrate 1. The thermosetting resin contains a resin component having a softening point lower than the softening point of the thermoplastic resin. The thickness of the first layer 72 is set thinner than the thickness of the second layer 71.

Examples of the thermoplastic resin forming the second layer 71 of the first adhesive layer 7*a* include fluoropolymer, liquid crystal polymer (LCP), polyimide (PI), and polyphenylene ether (PPE). Examples of the thermosetting resin forming the first layer 72 of the first adhesive layer 7*a* include epoxy resin and polyimide (PI). As a result, thermal strain during curing is reduced, cracking can be prevented when forming the laminate, and the adhesion to the first insulating substrate 1 can be further improved. In one example, the second layer 71 of the first adhesive layer 7*a* is liquid crystal polymer, and the first layer 72 of the first adhesive layer 7*a* is epoxy. After thermocompression bonding, the laminate is slowly cooled to room temperature.

In one example, after the lamination process, a protection layer is provided on the surface of the first insulating substrate 1 and immersed in hydrofluoric acid to etch the patterned exposed portions of the protection layer. Here, the embedment portion 1*c* is formed by etching, and grooves for dicing are also formed by etching. Then, singulation is performed through dicing along the formed grooves for dicing. This is expected to improve the positional accuracy of the embedment portion 1*c*. Also, the dicing time can be shortened. As a configuration other than the above, the first insulating substrate 1 having the embedment portion 1*c* formed in advance may be used.

The semiconductor device 9 is embedded in the embedment portion 1*c* of the first insulating substrate 1, and the gap between the embedment portion 1*c* and the semiconductor device 9 is filled with the filler 6, which is then cured. Subsequently, with the semiconductor device 9 accommodated and embedded in the first insulating substrate 1 of the outer layer of the multilayer substrate, a second external electrode 9*b* of the semiconductor device 9 is connected by solder 13 to some of the external electrodes of a first electronic component 15*a* mounted on the outer layer of the multilayer substrate. Also, the wiring pattern of the fourth metal layer 1*b* of the outer layer of the multilayer substrate is connected by the solder 13 to some of the other external electrodes of the first electronic component 15*a*. In one example, the first electronic component 15*a* is a surface-mount CPU, and the semiconductor device 9 is a chip-shaped optical device (photonic chip).

In one example, an optical waveguide 15*b* is formed by patterning, and the optical device 9 and the optical wave-guide 15*b* are coupled. As a configuration other than the above, the optical waveguide 15*b* may be formed by ion exchange processing. As a configuration other than the above, the optical waveguide 15*b* may be replaced with a connector for connecting an optical waveguide.

The optical device 9 provides signal connection between the first electronic component 15*a* and the waveguide 15*b*. Here, the first electronic component 15*a* and the waveguide 15*b* are mounted on the circuit board 10A, and then an outer peripheral frame is attached to complete the electronic device 20A.

Next, the second example is described below, focusing on the differences from the first example.

Second Example

The second example is an electronic device 20B including an optical signal processing circuit and an electrical signal processing circuit. A circuit board 10B has a configuration in which the first insulating substrate 1, which is made of glass and has a lower surface on which the first metal layer 1*a* is formed, is laminated on the second insulating substrate 2, which is made of glass and has a lower surface on which the second metal layer 2*a* is formed, while interposing the first adhesive layer 7*a*, which contains a thermoplastic resin, and an optical device 9 is embedded in the embedment portion 1*c* formed in the first insulating substrate 1. In one example, the optical device 9 is mounted on the multilayer substrate in a stage before the first insulating substrate 1 is laminated, and the first external electrode 9*a* on the lower side of the optical device 9 is connected to the wiring pattern of a fifth metal layer 2*b* through conductive paste 14. Then, the first insulating substrate 1 with the optical waveguide 15*d* formed therein is laminated on the second insulating sub-strate 2 while interposing the first adhesive layer 7*a* to form an integrated structure. The first electronic component 15*a* is then mounted.

Figure 5:
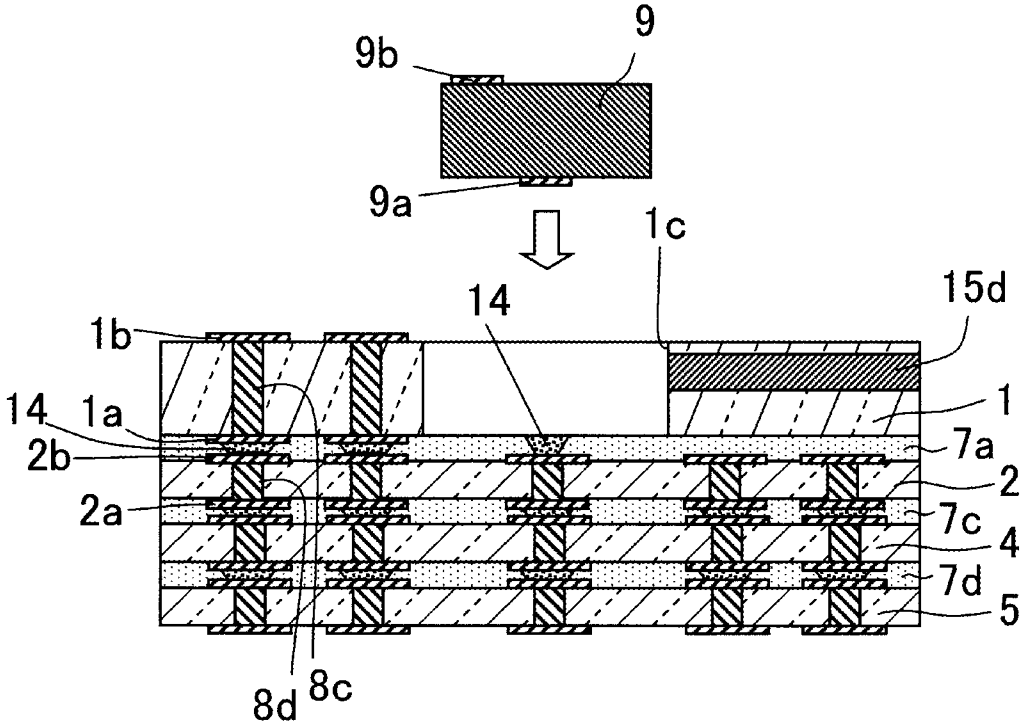
FIG. 5 is a cross-sectional view schematically showing a stage before a semiconductor device is embedded in the second example.

FIG. 5 is a cross-sectional view schematically showing a laminate of the second example in a stage before the optical device 9 is embedded. A method for manufacturing the laminate includes a lamination process in which the fifth insulating substrate 5, the fourth adhesive layer 7*d*, the fourth insulating substrate 4, the third adhesive layer 7*c*, the second insulating substrate 2, the first adhesive layer 7*a*, and the first insulating substrate 1 are built up in this order and collectively subjected to thermocompression bonding. After thermocompression bonding, the laminate is slowly cooled to room temperature.

In one example, the optical waveguide 15*b* is formed by ion exchange processing, and the optical device 9 and the optical waveguide 15*b* are coupled. As a configuration other than the above, the optical waveguide 15*b* may be formed by patterning. As a configuration other than the above, a connector for connecting an optical waveguide may be retrofitted in place of the optical waveguide 15*b*.

Next, the third example is described below, focusing on the differences from the first example and the second example.

Third Example

The third example is an electronic device 20C having a circuit board 10C in which the semiconductor device 9 is embedded. The circuit board 10C has a configuration in which the first insulating substrate 1, which is made of glass and has a lower surface on which the first metal layer 1*a* is formed, is laminated on the second insulating substrate 2, which is made of glass and has a lower surface on which the second metal layer 2*a* is formed, while interposing the first adhesive layer 7*a*, which contains a thermoplastic resin, the third insulating substrate 3, which is made of glass and has an upper surface on which a third metal layer 3*a* is formed, is laminated on the first insulating substrate 1 while inter-posing the second adhesive layer 7*b*, which contains a thermoplastic resin, and the semiconductor device 9 is embedded in the embedment portion 1*c* formed in the first insulating substrate 1. In one example, the semiconductor device 9 is mounted on the multilayer substrate in a stage before the first insulating substrate 1 is laminated, and the first external electrode 9*a* on the lower side of the semicon-ductor device 9 is connected to the wiring pattern of the second metal layer 2*a* through a first via 8*a* formed by filling a through hole with conductive paste. After the semicon-ductor device 9 is mounted, the first insulating substrate 1 is laminated on the second insulating substrate 2 while inter-posing the first adhesive layer 7*a*. After the first insulating substrate 1 is laminated, the third insulating substrate 3 is laminated on the first insulating substrate 1 while interpos-ing the second adhesive layer 7*b* to form an integrated structure. When the third insulating substrate 3 is laminated, the second external electrode 9*b* on the upper side of the semiconductor device 9 is connected to the wiring pattern of the third metal layer 3*a* through a second via 8*b* formed by filling a through hole with conductive paste. A second electronic component 15*c* is then mounted. In one example, the semiconductor device 9 is a chip-shaped integrated circuit.

Next, the fourth example is described below, focusing on the differences from the third example.

Fourth Example

The fourth example is an electronic device 20D having a circuit board 10D in which the semiconductor device 9 is embedded. The circuit board 10D includes a lamination process in which a heat sink 17, the third adhesive layer 7*c*, the second insulating substrate 2, the first adhesive layer 7*a*, the first insulating substrate 1, the second adhesive layer 7*b*, and a third insulating substrate are built up in this order and collectively subjected to thermocompression bonding. After thermocompression bonding, it is slowly cooled to room temperature. In one example, the semiconductor device 9 is mounted on the multilayer substrate in a stage before the first insulating substrate 1 is laminated, and a first external electrode 9*a* on the lower side of the semiconductor device 9 is connected to the wiring pattern of the second metal layer 2*a* through the first via 8*a* formed by filling a through hole with conductive paste. After the semiconductor device 9 is mounted, the first insulating substrate 1 is laminated on the second insulating substrate 2 through the first adhesive layer 7*a*. After the first insulating substrate 1 is laminated, the third insulating substrate 3 is laminated on the first insulating substrate 1 through the second adhesive layer 7*b* to form an integrated structure. When the third insulating substrate 3 is laminated, the second external electrode 9*b* on the upper side of the semiconductor device 9 is connected to the wiring pattern of the third metal layer 3*a* through the second via 8*b* formed by filling a through hole with conductive paste. Then, a solder resist 16 is formed on the outer layer of the multilayer substrate by printing, and the second electronic component 15*c* is mounted. In one example, the semiconductor device 9 is a power semiconductor.

In the first example described above, the laminate structure in which the first insulating substrate 1 is laminated on the second insulating substrate 2 while interposing the first adhesive layer 7*a* has been described. However, the laminate structure is not limited to the above example and may be a laminate structure in which the second insulating substrate 2 is laminated on the first insulating substrate 1 while interposing the first adhesive layer 7*a*. In the modification of the second example described above, the example in which the first adhesive layer 7*a* has a laminate structure in which the first layer 72 is placed on the second layer 71 has been described, but it is not limited to the above example. For example, the second adhesive layer 7*b* may have a laminate structure, and some or all of the adhesive layers may have a laminate structure.

The number of lamination layers of insulating substrates is not limited to the above example. For example, the total number of lamination layers may be 3, or the total number of lamination layers may be 5 or more. A known processing technique such as MSAP or ETS can be applied to form the laminate. The present invention is not limited to the embodiments described above, and various modifications can be made without departing from the scope of the present invention.

What is claimed is:

1. A circuit board being a multilayer wiring board in which insulating substrates which are made of glass as an inorganic material on which metal layers are formed are laminated while interposing heat-resistant adhesive layers, comprising a configuration in which an embedment portion penetrated in a laminating direction in a first insulating substrate of the insulating substrates made of the glass as the inorganic material is formed and a semiconductor device is embedded in the embedment portion with an upper surface of the semiconductor device exposed, wherein the adhesive layers contain a thermoplastic resin, the semiconductor device is an optical device, a first external electrode provided on a lower surface in the laminating direction of the optical device is configured to be connected by conductive paste to a second insulating substrate of the insulating substrates made of the glass as the inorganic material, and a first electronic component is mounted on the first insulating substrate, an optical waveguide is formed on the first insulating substrate, the first electronic component is directly connected to a second external electrode provided on the exposed upper surface in the laminating direction of the optical device without interposing the first insulating substrate, and the optical device is coupled to the optical waveguide.

2. An electronic device comprising the circuit board according to claim 1.

3. A method for manufacturing a circuit board being a multilayer wiring board by laminating insulating substrates which are made of glass as an inorganic material on which metal layers are formed while interposing heat-resistant adhesive layers wherein an embedment portion penetrated in a laminating direction in a first insulating substrate of the insulating substrates made of the glass as the inorganic material is formed, and a semiconductor device is embedded in the embedment portion with an upper surface of the semiconductor device exposed, and the adhesive layers contain a thermoplastic resin, the semiconductor device is an optical device, and the method for manufacturing a circuit board comprising: embedding the optical device in the embedment portion with an upper surface of the optical device exposed after laminating the first insulating substrate, and connecting a first external electrode provided on a lower surface in the laminating direction of the optical device by conductive paste to a second insulating substrate of the insulating substrates made of the glass as the inorganic material; and forming an optical waveguide on the first insulating substrate, coupling the optical device to the optical waveguide, mounting a first electronic component on the first insulating substrate, and directly connecting the first electronic component to a second external electrode provided on the exposed upper surface in the laminating direction of the optical device without interposing the first insulating substrate.

4. The method for manufacturing a circuit board according to claim 3, comprising forming the embedment portion by etching.

5. The method for manufacturing a circuit board according to claim 3, comprising forming the optical waveguide by patterning or ion exchange processing.

* * * * *